(12) United States Patent
Mae

(10) Patent No.: US 8,477,548 B2
(45) Date of Patent: Jul. 2, 2013

(54) SEMICONDUCTOR DEVICE EQUIPPED WITH A PLURALITY OF MEMORY BANKS AND TEST METHOD OF THE SEMICONDUCTOR DEVICE

(75) Inventor: Kenji Mae, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 182 days.

(21) Appl. No.: 13/172,252

(22) Filed: Jun. 29, 2011

(65) Prior Publication Data

US 2012/0002464 A1 Jan. 5, 2012

(30) Foreign Application Priority Data

Jun. 30, 2010 (JP) ................................. 2010-148935

(51) Int. Cl.
*G11C 7/00* (2006.01)
(52) U.S. Cl.
USPC . 365/201; 365/163; 365/189.04; 365/189.16; 365/190; 365/151

(58) Field of Classification Search
USPC ............... 365/201, 163, 189.04, 189.16, 190, 365/151
See application file for complete search history.

(56) References Cited

U.S. PATENT DOCUMENTS

| | | | | |
|---|---|---|---|---|
| 5,436,910 A | * | 7/1995 | Takeshima et al. | 714/718 |
| 5,903,514 A | * | 5/1999 | Sawada | 365/233.1 |
| 6,545,907 B1 | * | 4/2003 | Lowrey et al. | 365/163 |
| 7,349,245 B2 | * | 3/2008 | Kim et al. | 365/158 |
| 7,463,511 B2 | * | 12/2008 | Choi et al. | 365/163 |
| 7,471,556 B2 | * | 12/2008 | Chow et al. | 365/163 |
| 7,787,291 B2 | * | 8/2010 | Resta et al. | 365/163 |
| 7,885,102 B2 | * | 2/2011 | Hanzawa et al. | 365/163 |
| 8,149,616 B2 | * | 4/2012 | Bedeschi et al. | 365/163 |

FOREIGN PATENT DOCUMENTS

JP 2005-158221 A 6/2005

* cited by examiner

*Primary Examiner* — Viet Q Nguyen
(74) *Attorney, Agent, or Firm* — Sughrue Mion, PLLC

(57) ABSTRACT

A write circuit writes a first data signal that is an input data signal that indicates a first logic level to each memory bank in sequence and writes a second data signal that is an input data signal that indicates a second logic level to each memory bank simultaneously.

19 Claims, 9 Drawing Sheets

SEMICONDUCTOR DEVICE EQUIPPED WITH A PLURALITY OF MEMORY BANKS AND TEST METHOD OF THE SEMICONDUCTOR DEVICE

BACKGROUND OF THE INVENTION

1. Field of the Invention

The present invention relates to a semiconductor device and to a test method of the semiconductor device.

2. Description of the Related Art

Patent Document 1 (JP-A-2005-158221) discloses a typical form of a phase-change memory (PRAM: phase-change random access memory) device that is a nonvolatile memory device that stores data by using phase-change memory elements that are formed of a phase-change material in which resistance is changed by phase transitions.

The operation of writing data (hereinbelow referred to as a write operation) to a phase-change memory device includes a set operation of writing data by changing phase-change material from an amorphous state to a crystalline state and a reset operation of writing data by changing the phase-change material from a crystalline state to an amorphous state.

In a write operation, a pulse current is applied to the phase-change material, and this operation is characterized in that the time interval of the application of this pulse current is shorter at the time of the reset operation than at the time of the set operation and the amount of current of this pulse current is greater at the time of the reset operation than at the time of the set operation (see FIG. 12 and FIG. 13 of Patent Document 1).

In the operation control of a phase-change memory device having the above-described characteristics, the timing of a write operation is determined according to the set operation, which takes more time to write data, to enable the writing of data in a set operation as well as in a reset operation.

In addition, in an operation test of a typical semiconductor device that is equipped with a memory cell, a test pattern signal is written to the memory cell, following which the test pattern signal is read from the memory cell. The test pattern signal that was read is then compared with the test pattern signal that was written.

When the semiconductor device is equipped with a plurality of memory banks in the above-described operation test, there is a method that can shorten the time relating to the operation test by simultaneously writing the test pattern signal to each memory bank.

However, in the case of a phase-change memory device, the amount of current relating to the write operation of a phase-change memory device is relatively great and the amount of current therefore becomes excessive when the test pattern signal is simultaneously written to each memory bank. As a result, simultaneously writing the test pattern signal to each memory bank is problematic.

Accordingly, the write operation must be carried out separately to each memory bank in a phase-change memory device, as shown in FIG. 1. However, the timing of the write operation is determined according to the set operation, which takes more time to write data, and when the write operation is carried out separately for each memory bank, the problems arise that the time relating to the operation test becomes exceedingly long and the costs relating to the operation test become prohibitive.

SUMMARY

In one embodiment, a semiconductor device is proposed that is equipped with: a plurality of memory banks; and a write circuit that writes a first data signal that is an input data signal that indicates a first logic level to each memory bank in sequence and writes a second data signal that is an input data signal that indicates a second logic level to each memory bank simultaneously.

In another embodiment, a semiconductor device is proposed that is equipped with: a plurality of phase-change memory banks; and a write circuit that writes an input data signal that indicates a first logic level to each memory bank in sequence in a reset operation and writes an input data signal that indicates a second logic level to each memory bank simultaneously in a set operation.

In another embodiment, a test method is proposed that is a test method of a semiconductor device that is equipped with a plurality of memory banks, the test including: writing a first data signal that is an input data signal that indicates a first logic level to each memory bank in sequence and writing a second data signal that is an input data signal that indicates a second logic level to each memory bank simultaneously.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1:
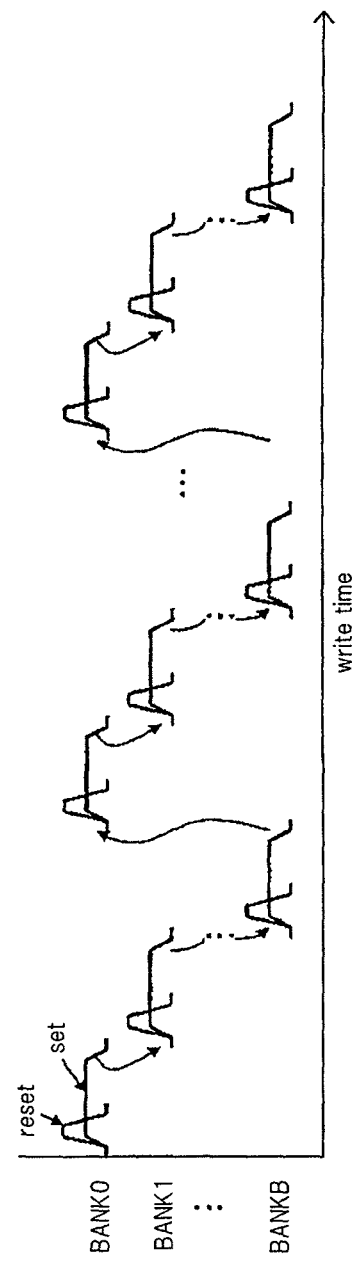
FIG. 1 is a timing chart for describing the problems of the operation of a phase-change memory device.
Figure 2:
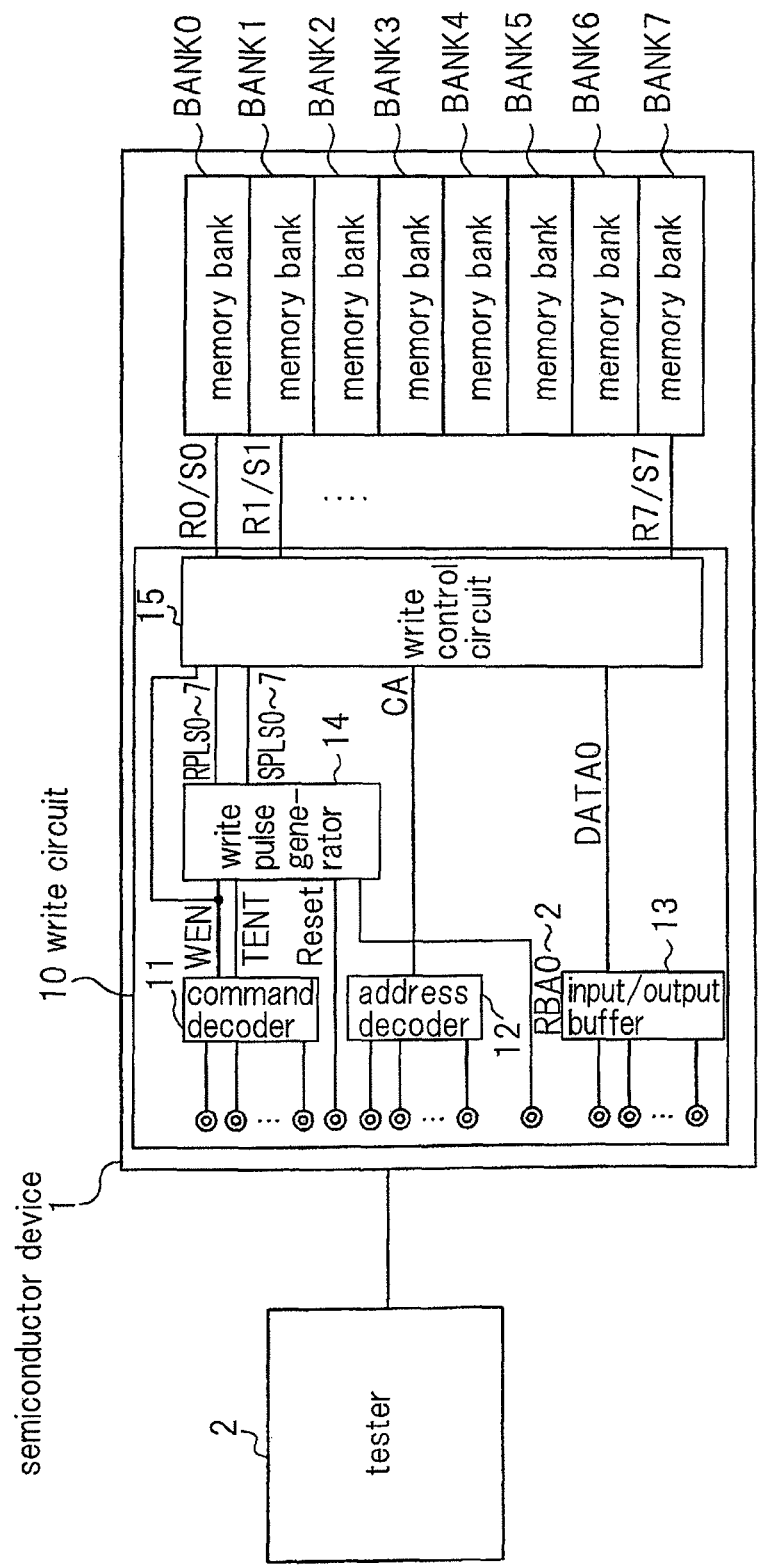
FIG. 2 is a block diagram showing the configuration of the semiconductor device of the first embodiment of the present invention.

FIG. 2 is a block diagram showing the configuration of the semiconductor device (phase-change memory device) of a first embodiment of the present invention. In FIG. 2, semiconductor device 1 is equipped with memory banks BANK0-7 and write circuit 10. Semiconductor device 1 is further connected to tester 2 provided for the purpose of carrying out an operation test of semiconductor device 1.

Memory banks BANK0-7 are of a configuration that is provided with a plurality of phase-change memory cells that are made up from phase-change memory elements that use a phase-change material in which resistance is changed by phase transition to store data. Although there are eight memory banks in FIG. 2, the number of memory banks can actually be more than two.

Write control circuit 10 is a circuit for writing input data signals to memory banks BANK0-7.

For example, when semiconductor device 1 is in the operation test mode, write circuit 10 writes a first data signal that is an input data signal that indicates a first logic level (hereinbelow referred to as L-level) to memory banks BANK0-7. Write circuit 10 then writes a second data signal that is an input data signal that indicates a second logic level (hereinbelow referred to as the H-level) to each of memory banks BANK0-7 simultaneously. At this time, write circuit 10 writes the first data signal in the reset operation and writes the second data signal simultaneously in the set operation. The input data signals and address information for designating the memory cells to which data are written in memory banks BANK0-7 are received from tester 2.

More specifically, write circuit 10 is equipped with command decoder 11, address decoder 12, input/output buffer 13, write pulse generator 14, and write control circuit 15.

Command decoder 11 receives various command signals from tester 2. Command decoder 11 is here assumed to receive as a command signal a test command signal indicating the execution of the operation test. Upon receiving the test command signal, command decoder 11 activates test signal TENT to both switch semiconductor device 1 to the operation test mode and activate write signal WEN.

Address decoder 12 receives from tester 2 an address signal designating the memory cell to which an input data signal is to be written, and in accordance with this address signal, supplies a column address signal CA that selects the memory cell to which the input data signal is to be written.

Input/output buffer 13 receives a data signal from tester 2 and supplies this input data signal as data signal DATA0.

Write pulse generator 14 receives an initialization signal Reset for setting the various circuits in semiconductor device 1 to the initial state from tester 2 and receives the write signal WEN and test signal TENT from command decoder 11.

When write signal WEN and test signal TENT are activated, write pulse generator 14 supplies reset pulse signals RPLS0-7 corresponding to each of memory banks BANK0-7 while shifting the time. Write pulse generator 14 also supplies set pulse signals SPLS0-7 corresponding to each of memory banks BANK0-7 simultaneously. At this time, write pulse generator 14 may supply set pulse signals SPLS0-7 after supplying reset pulse signals RPLS0-7, or may supply reset pulse signals RPLS0-7 after supplying set pulse signals SPLS0-7. In the following explanation, write pulse generator 14 is assumed to supply set pulse signals SPLS0-7 after having supplied reset pulse signals RPLS0-7.

Each of reset pulse signals RPLS0-7 is an example of the first pulse signal for writing data signal DATA0 in a reset operation, and each of set pulse signals SPLS0-7 is an example of the second pulse signal for writing data signal DATA0 in a set operation.

The pulse width of reset pulse signals RPLS0-7 is determined to be the same degree as the time of application of voltage (current) to the phase-change material in the reset operation, and the pulse width of set pulse signals SPLS0-7 is determined to be the same degree as the application time of voltage to the phase-change material in the set operation. The application time of voltage to the phase-change material in the set operation is longer than that of the reset operation, and the pulse width of set pulse signals SPLS0-7 is therefore longer than the pulse width of reset pulse signals RPLS0-7.

Apart from the above-described signals, write pulse generator 14 further receives bank address signals RBA0-2 that designate the memory banks to which data signal DATA0 is written. When semiconductor device 1 is in normal mode, write pulse generator 14 supplies only reset pulse signals and set pulse signals that correspond to memory banks that are designated in the bank address signals RBA0-2. In contrast, when semiconductor device 1 is in the operation test mode, data signal DATA0 is written to all of memory banks BANK0-7 regardless of the values of bank address signals RBA0-2, and bank address signals RBA0-2 may therefore always be deactivated.

Write control circuit 15 receives write signal WEN from command decoder 11, receives column address signal CA from address decoder 12, receives data signal DATA0 from input/output buffer 13, and receives reset pulse signals RPLS0-7 and set pulse signals SPLS0-7 from write pulse generator 14.

After write signal WEN has been activated, write control circuit 15 receives reset pulse signals RPLS0-7 and set pulse signals SPLS0-7 and then writes data signal DATA0 to memory cells that accord with column address signal CA in each of memory banks BANK0-7 in synchronization with these pulse signals that were received.

Here, data signal DATA0 that corresponds to the reset operation (first data signal) is data signal L, and data signal DATA0 that corresponds to the set operation (second data signal) is data signal H. In this case, write control circuit 15 writes data signal L to memory banks BANK0-7 in sequence in synchronization with reset pulse signals RPLS0-7 and simultaneously writes data signal H to memory banks BANK0-7 in synchronization with set pulse signals SPLS0-7.

In the present embodiment, write pulse generator 14 supplies set pulse signals SPLS0-7 after having supplied reset pulse signals RPLS0-7 and data writing is carried out sequentially in the reset operation and then sequentially the set operation. However, when write pulse generator 14 supplies reset pulse signals RPLS0-7 after having supplied set pulse signals SPLS0-7, operations are carried out sequentially in the set operation, and then sequentially in the reset operation.

Figure 3:
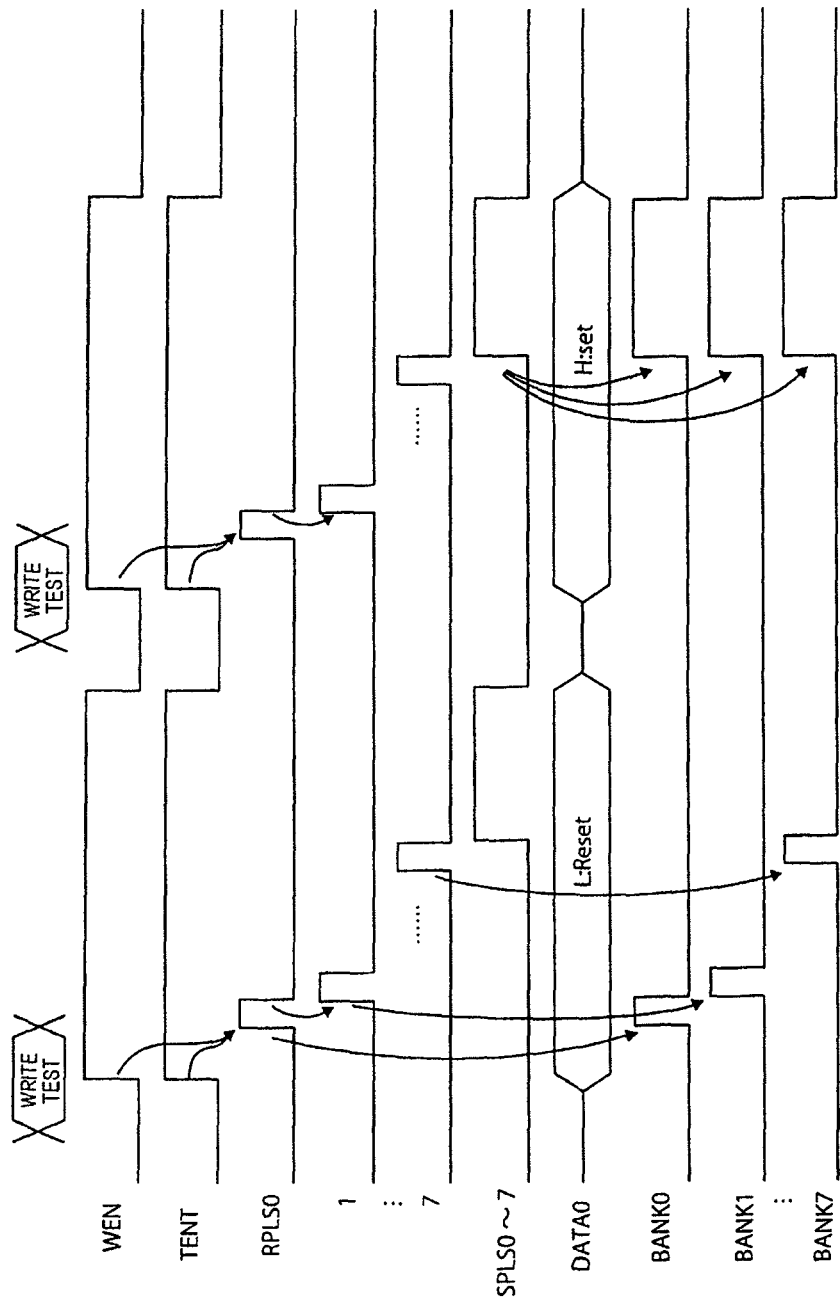
FIG. 3 is a timing chart for describing an example of the operation of the semiconductor device of the first embodiment of the present invention.

FIG. 3 is a timing chart for describing an example of the operations of the semiconductor device.

Tester 2 first supplies an initialization signal to semiconductor device 1, whereby circuits such as the latch circuit in write pulse generator 14 are initialized. Tester 2 then applies a test command signal (WRITE TEST) as input to command decoder 11, applies an address signal as input to address decoder 12, and applies a data signal as input to input/output buffer 13.

Upon the input of the test command signal, command decoder 11 activates write signal WEN and test signal TENT.

When write signal WEN and test signal TENT are activated, write pulse generator 14 supplies reset pulse signals RPLS0-7 in sequence as output. When reset pulse signals RPLS0-7 have all been supplied, write pulse generator 14 simultaneously supplies set pulse signals SPLS0-7.

When data signal DATA0 is L-level, write control circuit 15 supplies pulse voltage R0-R7 of the first voltage value to memory banks BANK0-7 in synchronization with the leading edge (the rising edge in FIG. 3) of each of reset pulse signals RPLS0-7 and then halts the supply of pulse voltage R0-R7 in synchronization with the trailing edge (the falling edge in FIG. 3) of each of reset pulse signals RPLS0-7.

On the other hand, when data signal DATA0 is H-level, write control circuit 15 supplies pulse voltage S0-S7 of the second voltage value to memory banks BANK0-7 in synchronization with the leading edge (the rising edge in FIG. 3) of each of set pulse signals SPLS0-7 and then halts the supply of the pulse voltage S0-S7 in synchronization with the trailing edge (the falling edge in FIG. 3) of each of set pulse signals SPLS0-7. The first voltage value is greater than the second voltage value.

Figure 4:
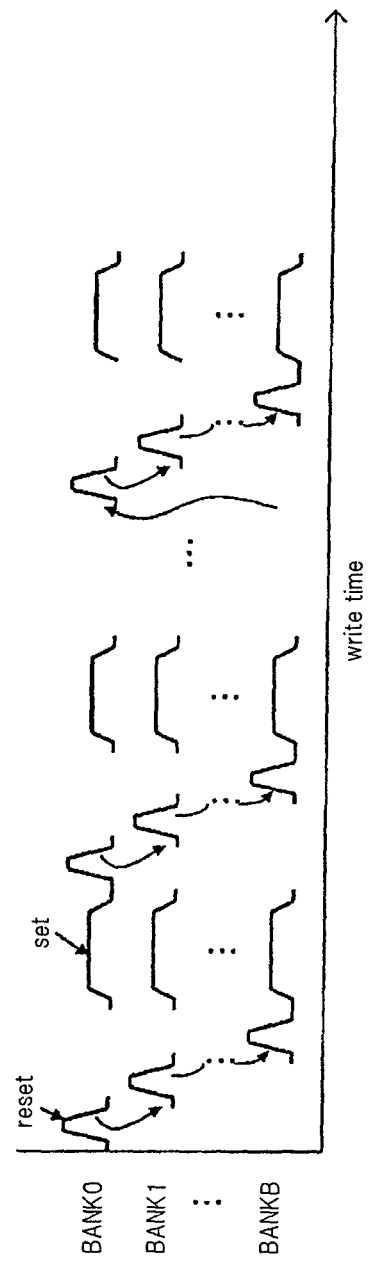
FIG. 4 is a view for describing the features of the semiconductor device of the first embodiment of the present invention.

According to the present embodiment as described hereinabove, as shown in FIG. 4, the first data signal is written in sequence to each of memory banks BANK0-7 following which the second data signal is simultaneously written, and the time relating to the operation test can therefore be shortened.

In the present embodiment, moreover, the first data signal is written to the memory banks in the reset operation and the second data signal is written to the memory banks in the set operation. The current amount of the pulse current for carrying out the set operation is lower than the current amount of the pulse current for carrying out the reset operation, whereby excess of the current amount that occurs when simultaneously writing the second data signal can be more greatly suppressed.

The internal circuits of the semiconductor device are next described in detail.

Figure 5:
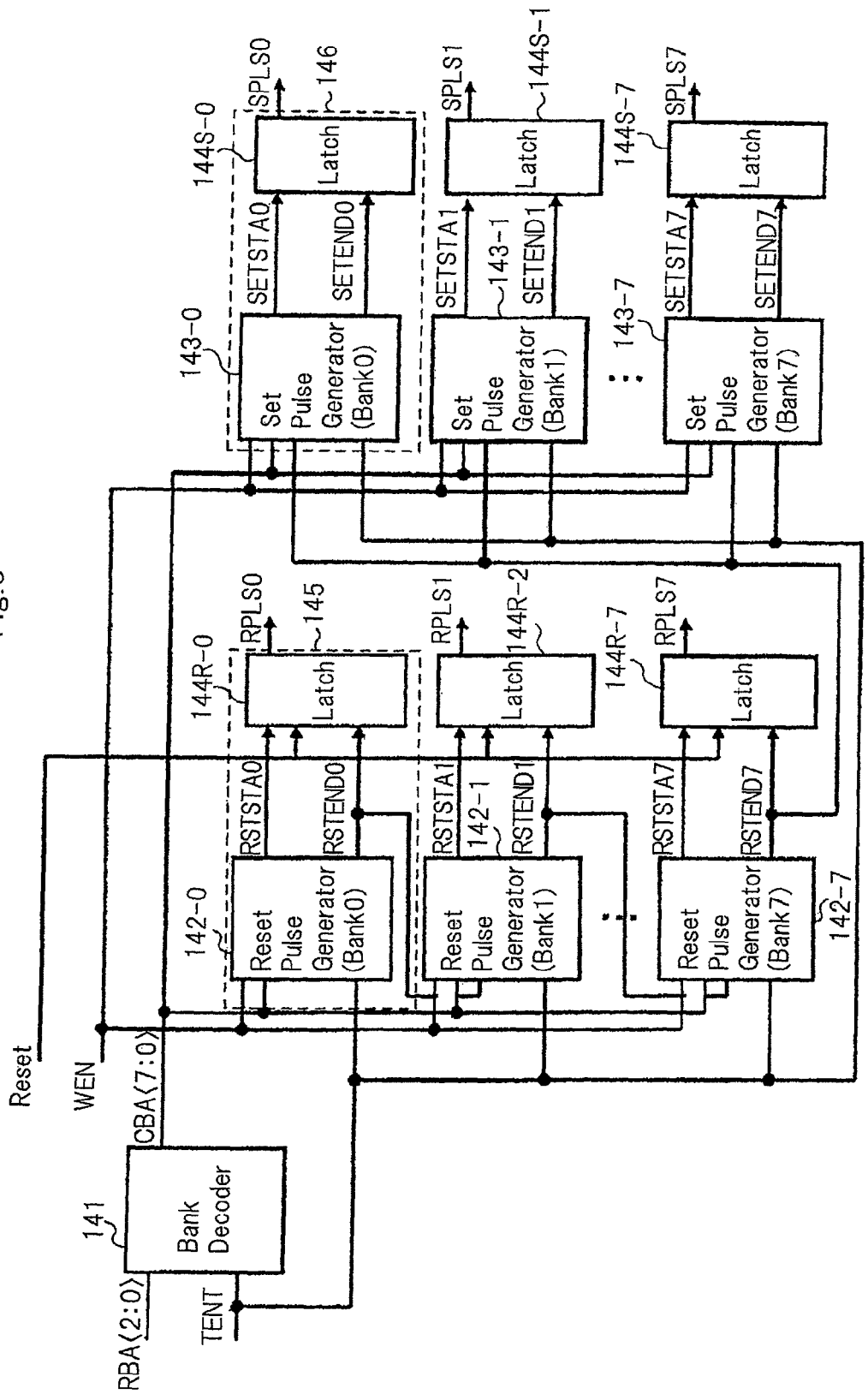
FIG. 5 shows an example of the configuration of the write pulse generator.

FIG. 5 shows an example of the configuration of write pulse generator 14. FIG. 5 shows a configuration of write pulse generator 14 that is capable of being used in common during an operation test and during normal operation.

In FIG. 5, write pulse generator 14 is equipped with bank decoder 141, reset pulse generators 142-0-7, set pulse generators 143-0-7, and latch circuits 144R-0-7 and 144S-0-7.

Bank decoder 141 receives bank address signals RBA<2:0> and test signal TENT. Bank address signal RBA<2:0> is a three-bit notation in which bank address signals RBA0-2 are integrated.

When semiconductor device 1 is in the operation test mode (i.e., when test signal TENT is activated), bank decoder 141 activates all of selection signals CBA<0>-CBA<7> that correspond to memory banks BANK0-7. Selection signals CBA<0>-CBA<7> are signals that are activated when data are to be written to the memory banks that correspond to the signals. Accordingly, data are written to each of memory banks BANK0-7 in the operation test mode. In the following description, selection signals CBA<0>-CBA<7> may be integrated and written as selection signals <7:0>.

On the other hand, when semiconductor device 1 is in normal mode (i.e., when test signal TENT is not activated), bank decoder 141 activates the signals of selection signals CBA<7:0> that correspond to memory banks designated by bank address signals RBA<2:0>.

Figure 6:
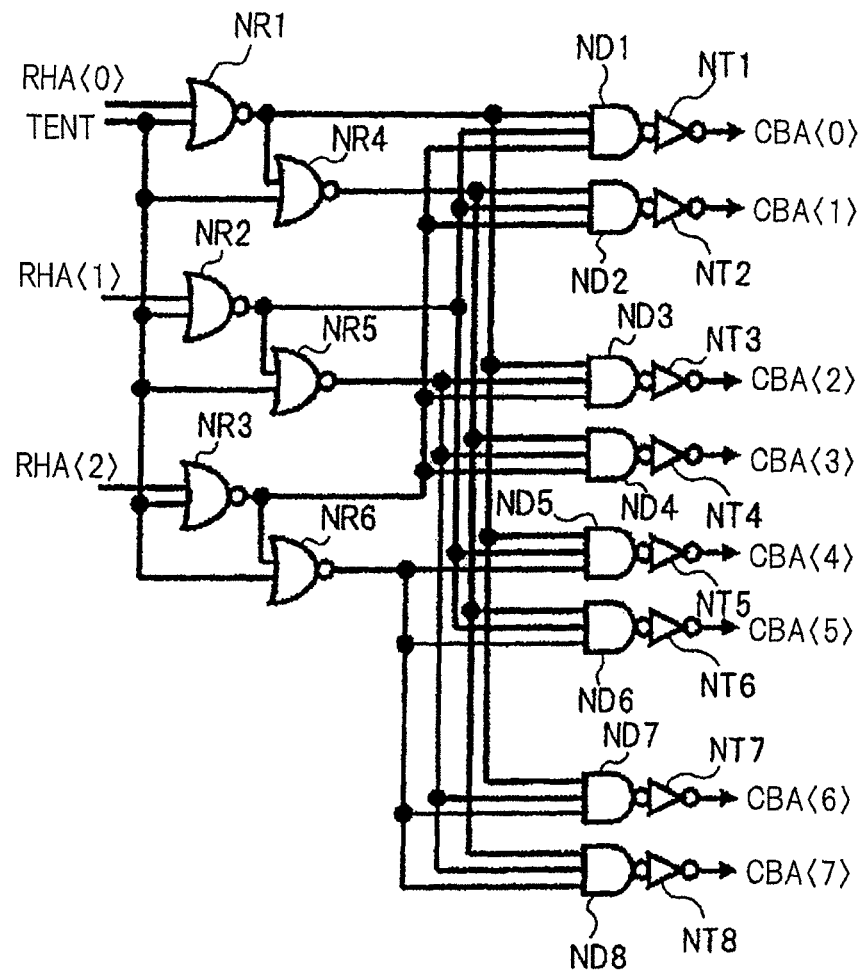
FIG. 6 shows an example of the configuration of a bank decoder.

FIG. 6 is a logic circuit diagram that shows an example of the configuration of bank decoder 141. In FIG. 6, bank decoder 141 is equipped with NOR circuits NR1-NR6, NAND circuits ND1-ND8, and NOT circuits NT1-NT8.

NOR circuits NR1-NR6 receive test signal TENT. In addition, NOR circuits NR1-NR3 receive any of bank address signals RBA<2:0> without duplication, and NOR circuits NR4-NR6 receive any of the output signals of NOR circuits NR1-NR3 without duplication.

Each of NAND circuits ND1-ND8 receives any three output signals of NOR circuits NR1-NR6 and supplies the NAND of these three output signals as any of selection signals CBA<7:0> by way of any of NOT circuits NT1-NT8. Here, the combinations of the signals received by each of NAND circuits ND1-ND8 are determined such that the values of bank address signals RBA<2:0> and the values of selection signals CBA<7:0> have a one-to-one correspondence.

By virtue of the above-described configuration, bank decoder 141 activates all of selection signals CBA<7:0> when test signal TENT is activated, and activates signals of selection signals CBA<7:0> that correspond to memory banks designated by bank address signals RBA<2:0> when test signal TENT is not activated.

Returning to FIG. 5, each of reset pulse generators 142-0-7 has a one-to correspondence with one of memory banks BANK0-7. In addition, each of reset pulse generators 142-0-7 receives write signal WEN and one of selection signals CBA<7:0>. In the following description, reset pulse generator 142-n is assumed to correspond to memory bank BANKn and receive selection signal CBA<n>. The variable n is an integer from 0 to 7.

When write signal WEN and selection signal CBA<n> are activated, reset pulse generator 142-n supplies a reset start signal RSTSTAn that indicates the output timing of reset pulse signal RPLSn to memory bank BANKn that corresponds to its own circuit and reset end signal RSTENDn that indicates the output end timing of the reset pulse signal.

More specifically, reset pulse generators 142-n further receives a timing signal that indicates the output timing of reset start signal RSTSTAn and supplies reset start signal RSTSTAn in synchronization with the timing signal, and after a fixed interval, supplies reset end signal RSTENDn.

Here, the output order is determined in advance for each of reset pulse generators 142-0-7. The timing signal of reset pulse generator 142-0 that is the first in output order is write signal WEN, and the timing signals of reset pulse generators 142-1-7 that are the second and succeeding in output order are each assumed to be the reset end signal supplied from the reset pulse generator that has the immediately preceding output order.

Each of set pulse generators 143-0-7 has a one-to-one correspondence with one of memory banks BANK0-7. In addition, each of set pulse generators 143-0-7 receives write signal WEN and one of selection signals CBA<7:0>. In the following explanation, set pulse generator 143-n is assumed to correspond to memory bank BANKn and receive selection signal CBA<n>.

When write signal WEN and selection signal CBA<n> are activated, set pulse generator 143-n supplies set start signal SETSTAn that indicates the output timing of set pulse signal SPLSn to memory bank BANKn that corresponds to its own circuit and set end signal SETENDn that indicates the output end timing of the set pulse signal.

Figure 7:
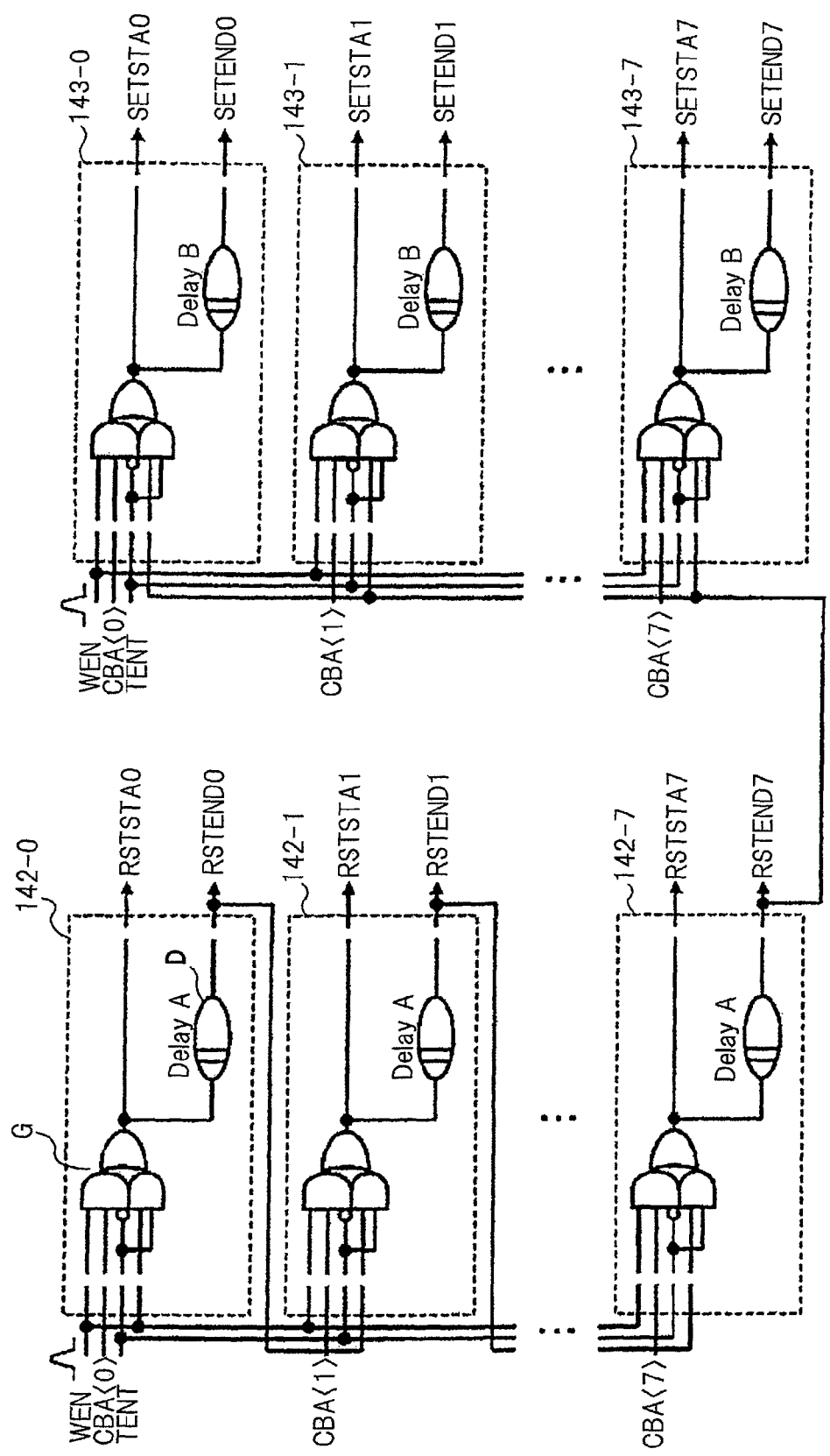
FIG. 7 shows an example of the configuration of the reset pulse generator and the set pulse generator.

More specifically, set pulse generator 143-n receives reset end signal RSTEND7 of reset pulse generator 142-7 for which the output order is last as the timing signal that indicates the output timing of set start signal SETSTAn, supplies set start signal SETSTAn in synchronization with the reset end signal RSTEND7, and after a fixed interval, supplies set end signal SETENDn. FIG. 7 shows an example of the configuration of reset pulse generators 142-0-142-7 and set pulse generators 143-0-143-7.

In FIG. 7, each of reset pulse generators 142-0-142-7 and set pulse generators 143-0-143-7 is equipped with compound gate circuit G and delay circuit D. The delay amount A of delay circuits D of reset pulse generators 142-0-142-7 is shorter than delay amount B of delay circuits D of set pulse generators 143-0-143-7.

Compound gate circuits G are each equipped with a three-input AND circuit, a two-input AND circuit, and an OR circuit that receives the output signal of these circuits.

The three-input AND circuit receives as input write signal WEN, any of selection signals CBA<7:0>, and the inverted signal of test signal TENT. A timing signal (one signal from among a write signal WEN and reset end signals RSTEND0-6) that indicates the output timing of reset start signal RST- STAn and test signal TENT are applied as input to the two-input AND circuit in reset pulse generator 142-n. A timing signal that indicates the output timing of set start signal SETSTAn (reset end signal RSTEND7) and test signal TENT are applied as input to the two-input AND circuit in set pulse generator 143-n. Delay circuit D delays and supplies the output signal of the OR circuit of compound gate circuit G.

Accordingly, the signal that is directly supplied as output from the OR circuit is reset start signal RSTSTA0-7 or set start signal SETSTA0-7, and the signal supplied from OR circuit by way of signal delay circuit D is reset end signal RSTEND0-7 or set end signal SETEND0-7.

Of the three-input AND circuit and two-input AND circuit, the component that is involved during the operation test mode is the two-input AND circuit, and the component that is involved during the normal operation mode is the three-input AND circuit. During the normal operation mode, the two-input AND circuit is deactivated, i.e., the output signal is fixed to the L-level signal. In addition, during the normal operation mode, one of selection signals CBA<7:0> is activated, whereby the write operation is carried out in, from among memory banks BANK0-7, only the memory bank that was selected by the activated selection signal CBA<7:0>, and the other memory banks are not successively accessed or simultaneously accessed.

In addition, in the configuration shown in FIG. 7, set start signals SETSTA0-7 and set end signals SETEND0-7 are supplied as output after the output of reset start signals RSTSTA0-7 and reset end signals RSTEND0-7. As a result, the writing of data signal DATA0 is carried out sequentially in reset operation and set operation. However, if the signals that are applied as input to two-input AND circuits in set pulse generators 143-0-143-7 are changed to write signal WEN and test signal TENT and if the signals that are applied as input to two-input AND circuit in reset pulse generator 142-0 are changed to set end signal SETEND and test signal TENT, reset start signals RSTSTA0-7 and reset end signals RSTEND0-7 are supplied as output after the output of set start signals SETSTA0-7 and set end signals SETEND0-7 have been supplied as output. In this case, the writing of data signal DATA0 is carried out in the order of the set operation and the reset operation.

Returning to FIG. 5, each of latch circuits 144R-0-7 is in a one-to-one correspondence with one of memory banks BANK0-7. In addition, each of latch circuits 144S-0-7 is in a one-to-one correspondence with one of memory banks BANK0-7. It is next assumed that latch circuits 144R-n and 144S-n correspond to memory bank BANKn.

Latch circuit 144R-n is the output circuit that supplies reset pulse signal RPLSn in accordance with the reset start signal RSTSTAn and reset end signal RSTENDn of reset pulse generator 142-n. More specifically, latch circuit 144R-n latches reset start signal RSTSTAn until reset end signal RSTENDn is activated and supplies the signal as reset pulse signal RPLSn.

In addition, latch circuit 144S-n supplies set pulse signal SPLSn in accordance with set start signal SETSTAn and set end signal SETENDn from set pulse generator 143-n. More specifically, latch circuit 144S-n latches set start signal SETSTAn until set end signal SETENDn is activated and supplies the signal as set pulse signal SPLSn.

Figure 8:
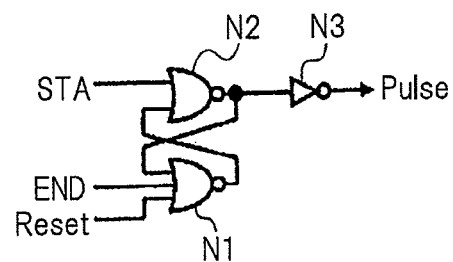
FIG. 8 shows an example of the configuration of a latch circuit.

FIG. 8 shows an example of the configuration of a latch circuit. In FIG. 8, the latch circuit is equipped with three-input NOR circuit N1, two-input NOR circuit N2, and NOT circuit N3. Because the configuration of the latch circuit is common to latch circuits 144R-0-7 and latch circuits 144S-0-7, in the following explanation, set start signals and reset start signals are referred to as start signals STA and set end signals and reset end signals are referred to as end signals END.

End signal END, initialization signal Reset, and the output signal of two-input NOR circuit N2 are applied as input to three-input NOR circuit N1. Start signal STA and the output signal of three-input NOR circuit N1 are applied as input to two-input NOR circuit N2. The output signal of two-input NOR circuit N2 is applied as input to NOT circuit N3.

By means of this configuration, a pulse signal (reset pulse signal or set pulse signal) having the interval from the activation of start signal STA until the activation of end signal END as the pulse width is supplied from NOT circuit N3.

By providing the above-described configuration, each of first generators 145 that are made up from reset pulse generators and latch circuits that correspond to memory banks that are identical to each other supplies reset pulse signals in accordance with an output order to the memory bank that corresponds to its own circuit. In addition, each of second generators 145 that are made up from set pulse generators and latch circuits and that correspond to memory banks that are identical to each other simultaneously supplies a reset pulse signal to the memory bank that corresponds to its own circuit.

Figure 9:
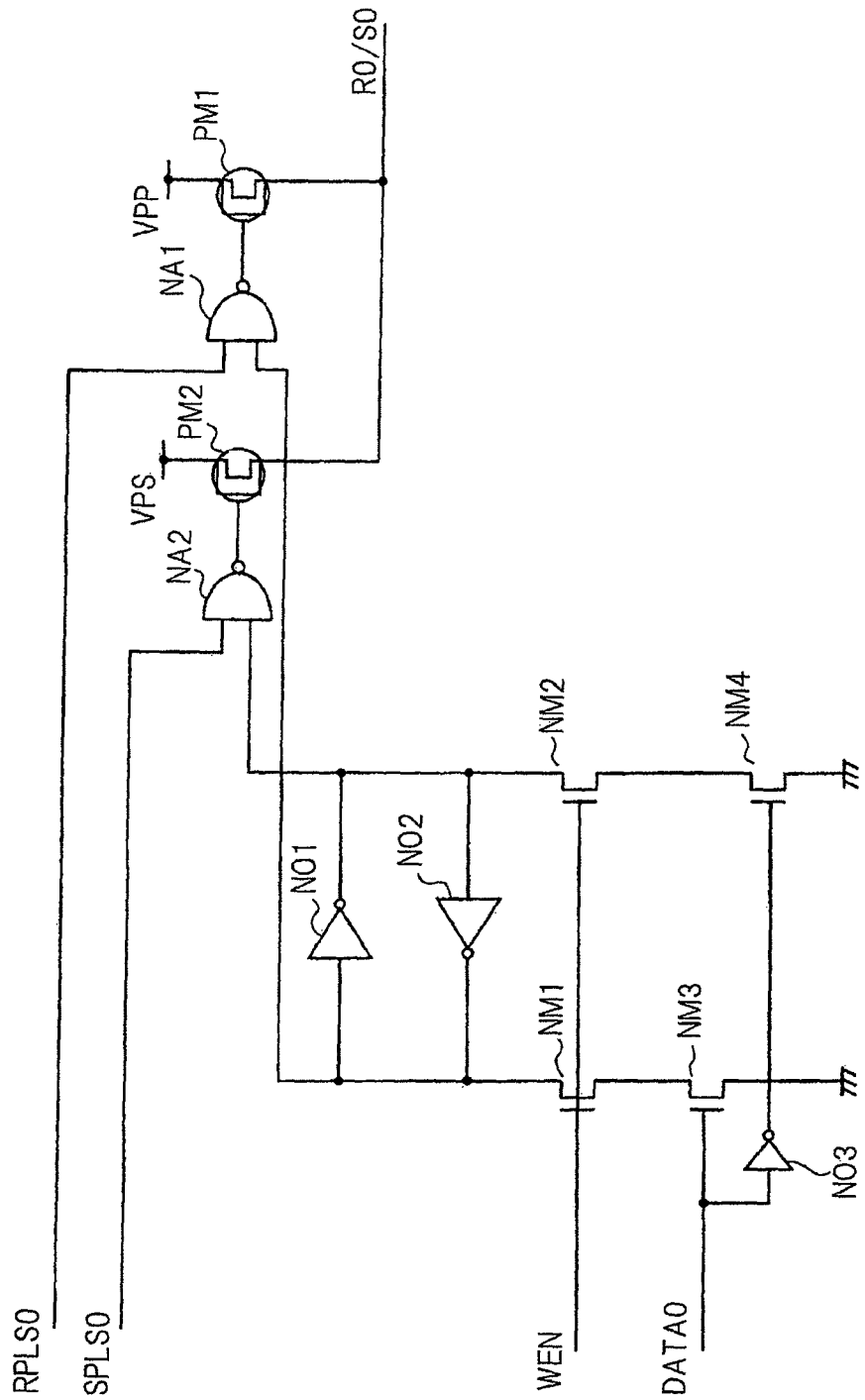
FIG. 9 shows an example of the configuration of a write control circuit.

Write control circuit 15 is next described in detail. FIG. 9 shows an example of the configuration of write control circuit 15. In FIG. 9, only portions that correspond to memory bank BANK0 are shown.

In FIG. 9, write control circuit 15 is equipped with pMOS transistors PM1 and PM2, nMOS transistors NM1-NM4, NAND circuits NA1 and NA2, and NOT circuits NO1-3.

NAND circuits NA1 and NA2 are two-input circuits. Reset pulse signals RPLS0 is applied as input to one input terminal of NAND circuit NA1 and the other input terminal is grounded by way of nMOS transistors NM1 and NM3. In addition, set pulse signal SPLS0 is applied as input to one input terminal of NAND circuit NA2 and the other input terminal is grounded by way of nMOS transistors NM2 and NM4.

Write signal WEN is applied as input to the gates of nMOS transistors NM1 and NM2, data signal DATA0 is applied as input to the gate of nMOS transistor NM3, and a signal obtained by inverting data signal DATA0 in NOT circuit NO3 is applied as input to nMOS transistor NM4.

NOT circuit NO1 inverts the input signal to the other input terminal of NAND circuit NA2 and applies the result to the other input terminal of NAND circuit NA1. In addition, NOT circuit NO2 inverts the input signal to the other input terminal of NAND circuit NA1 and applies the result to the other input terminal of NAND circuit NA2.

The sources of pMOS transistors PM1 and PM2 are connected in common, the drain of pMOS transistor PM1 is connected to the power-supply terminal of voltage value VPP, and the drain of pMOS transistor PM2 is connected to the power-supply terminal of voltage value VPS. Here, voltage value VPP is greater than voltage value VPS.

The gate of pMOS transistor PM1 is connected to the output terminal of NAND circuit NA1, and the gate of pMOS transistor PM2 is connected to the output terminal of NAND circuit NA2.

By providing the above-described configuration, pulse voltage S0 of voltage value VPS is supplied to memory bank BANK0 for exactly the interval of the pulse width of set pulse signal SPLS0 when data signal DATA0 is H-level, and pulse voltage R0 of voltage value VPP is supplied to memory bank BANK0 for exactly the interval of the pulse width of reset pulse signal RPLS0 when data signal DATA0 is L-level.

Although the data signal that is written to memory banks BANK0-7 was only data signal DATA0 in the present embodiment, a plurality of data signals may be written to memory banks BANK0-7. In such cases, the number of write control circuits 15 is increased according to the number of the data signals.

The semiconductor device according to the present embodiment is thus equipped with a plurality of memory banks (BANK0-7) and a write circuit (10) that writes a first data signal that is an input data signal that indicates a first logic level to each memory bank in sequence and writes a second data signal that is an input data signal that indicates a second logic level to each memory bank simultaneously.

In addition, the semiconductor device according to the present embodiment is of a configuration in which write circuit (10) is equipped with: write pulse generator (14) that supplies a plurality of first pulse signals that correspond to each memory bank (BANK0-7) in sequence and that simultaneously supplies a plurality of second pulse signals that correspond to each memory bank; and write control circuit (15) that, in synchronization with each first pulse signal that was supplied from write pulse generator (14), writes first data signals to memory banks (BANK0-7) that correspond to the first pulse signals, and further, writes second data signals to memory banks (BANK0-7) that correspond to the second pulse signals in synchronization with each second pulse signal that was supplied from write pulse generator (14).

In addition, the semiconductor device according to the present embodiment is of a configuration in which write pulse generator (14) is equipped with: a plurality of first generators (145) that each correspond to a memory bank (BANK0-7) and that supply to the corresponding memory bank (BANK0-7) first pulse signals in accordance with an output order that has been determined in advance; and a plurality of second generators (146) that each correspond to a memory bank (BANK0-7) and that simultaneously supply second pulse signals to the corresponding memory banks (BANK0-7).

In addition, the semiconductor device according to the present embodiment is of a configuration such that each first generator (145) is equipped with: signal generators (142-0-7) that each supply a start signal that indicates the output timing of the first pulse signal to the memory bank that corresponds to its own circuit and end signals that indicate the output end timing of the first pulse signal; and output circuits (144R-0-7) that each supply the first pulse signals from the output of the start signals until the output of the end signals; wherein signal generators that are equipped with first generators, for which the order of output is second or succeeding, supply start signals in synchronization with the end signal that was supplied from the signal generator (142-0-7) equipped with a first generator that has the immediately preceding order of output.

The semiconductor device according to the present embodiment is a semiconductor device in which each memory bank is made up from phase-change memory elements that use a phase-change material in which the resistance value changes by phase transition to store data.

In addition, the semiconductor device according to the present embodiment is of a configuration in which a write circuit (10) writes first data signals to memory banks (BANK0-7) in a reset operation and writes second data signals to memory banks (BANK0-7) in a set operation.

Finally, the semiconductor device according to the present embodiment is equipped with a plurality of phase-change memory banks (BANK0-7) and a write circuit (10) that writes an input data signal that indicates a first logic level to each memory bank in sequence in a reset operation and writes input data signals that indicate a second logic level to each memory bank simultaneously in a set operation.

It is apparent that the present invention is not limited to the above embodiments, but may be modified and changed without departing from the scope and spirit of the invention.

What is claimed is:

1. A semiconductor device comprising:
   a plurality of memory banks; and
   a write circuit that writes a first data signal that is an input data signal that indicates a first logic level to each memory bank in sequence and that simultaneously writes a second data signal that is an input data signal that indicates a second logic level to each memory bank.

2. The semiconductor device as set forth in claim 1, wherein said write circuit is provided with:
   a write pulse generator that successively supplies a plurality of first pulse signals that correspond to each memory bank and that simultaneously supplies a plurality of second pulse signals that correspond to each memory bank; and
   a write control circuit that, in synchronization with each first pulse signal supplied from said write pulse generator, writes said first data signal to the memory bank that corresponds to that first pulse signal, and, in synchronization with each second pulse signal supplied from said write pulse generator, writes said second data signal to the memory bank that corresponds to that second pulse signal.

3. The semiconductor device as set forth in claim 2, wherein said write pulse generator is provided with:
   a plurality of first generators that each correspond to one memory bank and that supply, corresponding to each memory bank, a first pulse signal to the corresponding memory bank in accordance with a predetermined output order; and
   a plurality of second generators that each correspond to one memory bank and that simultaneously supply, corresponding to each memory bank, a second pulse signal to the corresponding memory bank.

4. The semiconductor device as set forth in claim 3, wherein each first generator is provided with:
   a signal generator that supplies a start signal that indicates the output timing of a first pulse signal to the memory bank that corresponds to that signal generator and an end signal that indicates the output end timing of the first pulse signal; and
   an output circuit that supplies said first pulse signal in accordance with said start signal and said end signal;
   wherein signal generators provided in first generators having said output order that is second or succeeding supply said start signal in synchronization with the end signal that was supplied from the signal generator provided in the first generator that has the immediately preceding output order.

5. The semiconductor device as set forth in claim 1, wherein each memory bank is made up from phase-change memory elements that use a phase-change material in which the resistance value changes due to phase transition to store data.

6. The semiconductor device as set forth in claim 2, wherein each memory bank is made up from phase-change memory elements that use a phase-change material in which the resistance value changes due to phase transition to store data.

7. The semiconductor device as set forth in claim 3, wherein each memory bank is made up from phase-change memory elements that use a phase-change material in which the resistance value changes due to phase transition to store data.

8. The semiconductor device as set forth in claim 4, wherein each memory bank is made up from phase-change memory elements that use a phase-change material in which the resistance value changes due to phase transition to store data.

9. The semiconductor device as set forth in claim 5, wherein said write circuit writes said first data signals to said memory banks in a reset operation and writes said second data signal to said memory banks in a set operation.

10. The semiconductor device as set forth in claim 6, wherein said write circuit writes said first data signals to said memory banks in a reset operation and writes said second data signal to said memory banks in a set operation.

11. The semiconductor device as set forth in claim 7, wherein said write circuit writes said first data signals to said memory banks in a reset operation and writes said second data signal to said memory banks in a set operation.

12. The semiconductor device as set forth in claim 8, wherein said write circuit writes said first data signals to said memory banks in a reset operation and writes said second data signal to said memory banks in a set operation.

13. A semiconductor device comprising:
a plurality of phase-change memory banks; and
a write circuit that writes an input data signal that indicates a first logic level to each memory bank in sequence in a reset operation and writes an input data signal that indicates a second logic level to each memory bank simultaneously in a set operation.

14. A semiconductor device comprising:
a plurality of memory banks each including a plurality of memory cells; and
a write circuit writing an input data in parallel to each of specified ones of the memory cells of each of the memory banks when the input data is in a first state, and writing the input data in sequence to the each of the specified ones of the memory cells of each of the memory banks when the input data is in a second state.

15. The semiconductor device according to claim 14, wherein the input data in the first state makes the specified ones of the memory cells relatively low impedance and the input data in the second state makes the specified ones of the memory cells relatively high impedance.

16. The semiconductor device according to claim 15, wherein the memory cell includes a phase-change memory cell.

17. The semiconductor device according to claim 14, wherein the write circuit generates first write pulses each provided correspondingly to the memory banks in response to the input data in the first state, generating second write pulses each provided correspondingly to the memory banks in response to the input data in the second state, the second write pulses being greater in electrical potential than the first write pulses, and the first write pulses being longer in pulse length than the second write pulses.

18. The semiconductor device according to claim 17, wherein the second write pulses are not overlapped with each other.

19. The semiconductor device according to claim 18, wherein the first write pulses are overlapped with each other.

* * * * *